United States Patent [19]

Sakai et al.

[11] Patent Number: 4,466,876
[45] Date of Patent: Aug. 21, 1984

[54] THIN LAYER DEPOSITING APPARATUS

[75] Inventors: Takamasa Sakai; Yasuhiko Sato, both of Tokyo, Japan

[73] Assignee: Clarion Co., Ltd., Tokyo, Japan

[21] Appl. No.: 356,720

[22] Filed: Mar. 10, 1982

[30] Foreign Application Priority Data

Mar. 17, 1981 [JP] Japan .................. 56-36419[U]
Aug. 17, 1981 [JP] Japan .................. 56-121643[U]

[51] Int. Cl.³ .............................................. C23C 15/00
[52] U.S. Cl. ................................... 204/298; 204/192 R
[58] Field of Search ............................. 204/298, 192 R

[56] References Cited

U.S. PATENT DOCUMENTS

| 3,408,283 | 10/1968 | Chopra et al. | 204/298 |
| 3,409,529 | 11/1968 | Chopra et al. | 204/298 |
| 4,307,283 | 12/1981 | Zajac | 204/298 |
| 4,353,777 | 10/1982 | Jacob | 204/298 |

Primary Examiner—Arthur P. Demers
Attorney, Agent, or Firm—Russell E. Hattis

[57] ABSTRACT

A thin layer depositing apparatus comprising a reaction vessel for putting therein substrates to be provided with a desired thin layer and a gas accelerating nozzle positioned at a desired portion of the reaction vessel so that reactive gas is introduced in the reaction vessel through the gas accelerating nozzle.

14 Claims, 14 Drawing Figures

THIN LAYER DEPOSITING APPARATUS

BACKGROUND OF THE INVENTION

This invention relates to a thin layer depositing apparatus capable of regulating gas pressure profile of a reaction gas to bring it in a desired condition.

To deposit thin layers such as conductive films, insulating films, etc. during the manufacture of various parts of electronic devices, there have been adopted thin layer depositing apparatuses. Among these, sputtering apparatuses have recently widely been used in order to improve adherence, grain size, and flattening of films covering the unevenness of the surface of a substrate.

On depositing thin layers using such sputtering apparatuses, the gas pressure profile of reactive gas introduced in a reaction vessel substantially affects the quality of the deposited layer. The gas pressure profile becomes best when the reactive gas is so introduced within the reaction vessel that the diffusion speed along the reactive gas flow is equal to or faster than the diffusion speed to the horizontal direction of the gas flow.

FIG. 1 shows a skeleton diagram illustrating a conventional sputtering apparatus wherein the reference numeral 1 designates a reaction vessel and 2 denotes a reactive gas inlet. The numeral 3 refers to a reactive gas outlet positioned sufficiently away form the inlet 2. Reactive gas is introduced in the reaction vessel 1 from the inlet 2 as shown by the arrow mark. The introduced reactive gas expands and diffuses as advancing in, so that the gas pressure at point A is considerably higher than that at point B.

Accordingly, the relation between the longitudinal diffusion speed $V_x$ and the O transverse diffusion speed $V_y$ is considered to be expressed by $V_x \geq V_y$. Considering, however, that the thermal motion velocity v of the reactive gas ($\simeq \sqrt{kT/m}$) (T=temperature, m=molecular weight and K=constant) and the horizontal diffusion speed $V_y$ are substantially the same, it is difficult to satisfy the above-mentioned relation $V_x \geq V_y$. The reactive gas also diffuses to the directions as shown by the dotted lined arrows, resulting in expansion about the reactive gas inlet 2, and the desired gas pressure profile cannot easily be obtained. In order to satisfy the relation $V_x \geq V_y$, there is proposed herein a method to increase the amount of the gas to be introduced, namely to form the entire body of the reaction vessel as a nozzle and to rapidly discharge the reactive gas, using a vacuum pump with large capacity, so as to rectify the gas flow to the longitudinal direction (x direction) as shown in FIG. 2(A) and increase the gas speed $V_x$ as it gets nearer to the outlet 3. To realize the proposal, however, not only a powerful discharge apparatus is necessary, but also the amount of the reactive gas to be used increases. Therefore the cost increases, and it is difficult to properly regulate the reactive gas, resulting in difficulty in obtaining the desired gas pressure profile.

Such impossibility of obtaining the desired gas pressure profile causes scattering of sputtering material as well as diminution of kinetic energy due to reduction of mean free path, and insufficiency of sputtering rate or abnormal growth of the layer due to re-adhesion of the scattered sputtering material on the target.

Particularly when it is desired to obtain a thin layer with good crystallization i.e. when obtaining a thin layer simultaneously satisfying the c axis orientation and theoretical chemical composition of the layer, we could only select the medium point of each of the above-cited conditions as the best condition for satisfying both of them, because those requirements have opposite dependencies on the gas pressure profile, respectively. Those problems have been evident in case of depositing a layer of conjugated material such as oxides and nitrides. A solution has been long needed for this.

OBJECT OF THE INVENTION

It is therefore an object of the present invention to solve the above problems. To this end, the present invention provides a thin layer depositing apparatus having an accelerating nozzle provided in a desired position within a reaction vessel for introducing reactive gas into the reaction vessel through the nozzle so that the longitudinal diffusion speed of the reactive gas is kept same as or larger than the transverse diffusion speed.

SUMMARY OF THE INVENTION

In accordance with the present invention, there is provided a thin layer depositing apparatus which comprises:

a reaction vessel;

substrates supported within said reaction vessel;

a gas accelerating nozzle provided within said reaction vessel;

a gas supply means for supplying reactive gas in said reaction vessel through said nozzle; and a thin layer depositing means for depositing a thin layer on said substrate.

DETAILED DESCRIPTION OF THE PREFERRED EMBODIMENTS

Figure 1:
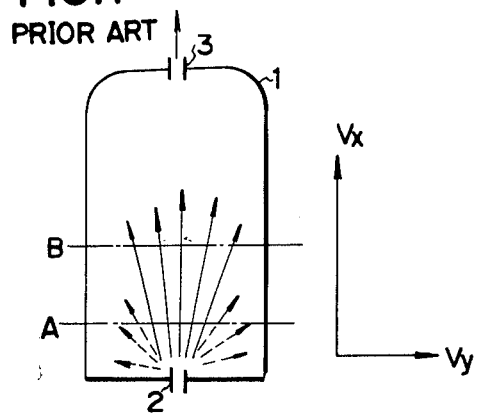
FIG. 1, FIG. 2(A) and FIG. 2(B) show skeleton drawings illustrating a conventional apparatus.
Figures 2A, 2B:
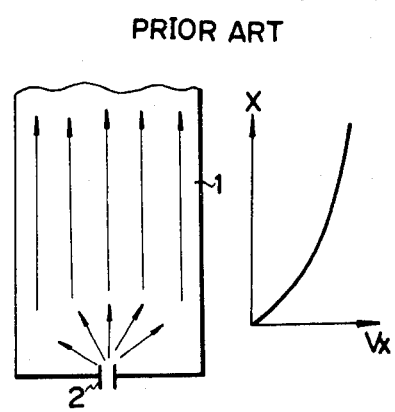

The present invention will now be described in detail referring to the preferred embodiments illustrated in the drawings.

Figure 3A:
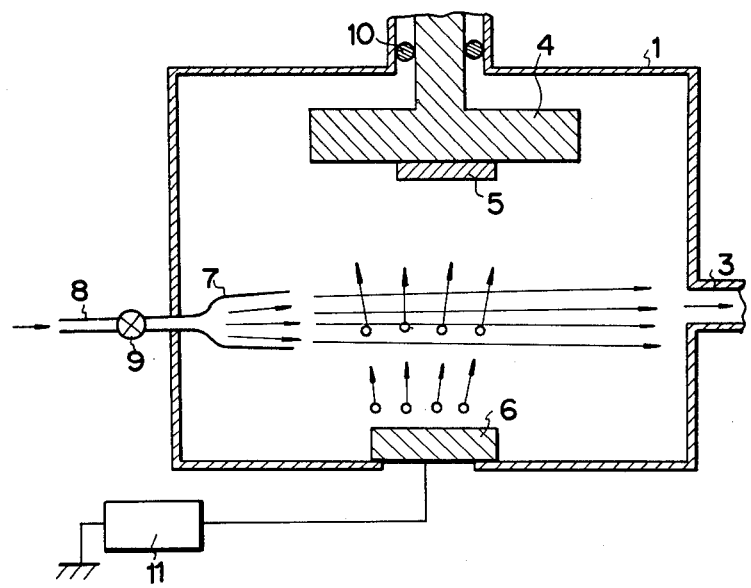
FIG. 3(A) and FIG. 3(B) show a sectional and top views, respectively, illustrating an embodiment according to the present invention.
Figure 3B:
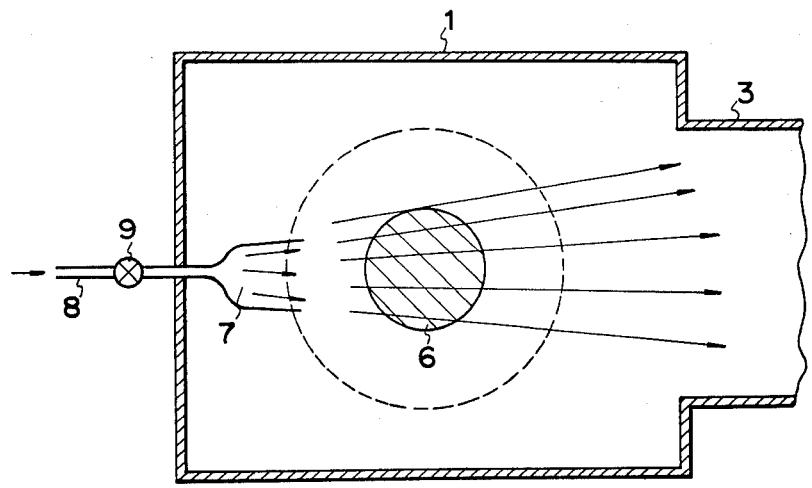

FIGS. 3(A) and 3(B) show sectional and top views, respectively, of an embodiment of the thin layer depositing apparatus according to the present invention wherein the same numerals as in FIG. 1 denote the same parts. The numeral 4 refers to a substrate holder, 5 to a substrate positioned on the substrate holder 4 to be coated with a thin layer 6 to a sputtering, 7 to a gas accelerating nozzle, 8 to a gas supply pipe, 9 to a gas quantity adjusting valve, 10 to an O-ring and 11 to a sputtering power source.

Figure 4:
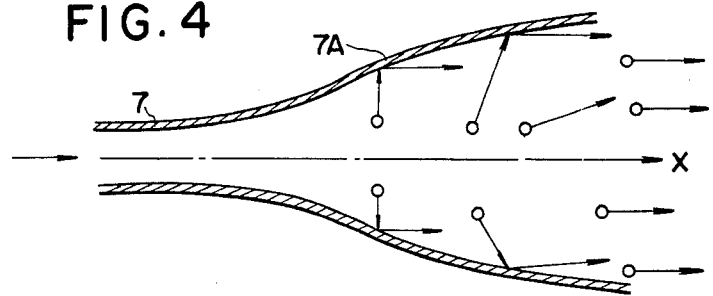
FIG. 4 shows a sectional view of the nozzle.

The gas accelerating nozzle 7 provided in the reaction vessel 1 permits the thermal motion energy of each reactive gas molecule to be converted into kinetic energy along the axis of the nozzle (longitudinal direction x) when the reactive gas is introduced in the reaction vessel 1 through the gas accelerating nozzle 7 as shown in FIG. 4, so that the longitudinal diffusion speed of the reactive gas is kept as fast as or faster than the horizontal diffusion speed. That is, in accordance with the design of the periphery of the sidewall 7A of the gas accelerating nozzle 7, the flow of the reactive gas can be accelerated up to substantially the same speed as the thermal motion speed of the gas molecule while the thermal motion energy thereof is effectively converted into the kinetic energy along the axis of the nozzle. More specifically, each gas molecule having its own thermal motion energy is accelerated as its flow direction along the sidewall 7A is forcedly changed to the axial direction of the nozzle by the slope of the sidewall 7A as shown in FIG. 4. Therefore, the vertical diffusion speed $V_y$ of the accelerated gas flow is made slower so as to keep the relation $V_x \geq V_y$ and so that a desired gas pressure profile can be obtained and only a thin gas flow is attained at the surface of the target 6. Due to this relation, atoms and molecules getting free from the target 6 effectively couple with each other to form a thin layer with high quality on the substrate 5.

Test 1: By a reactive sputtering method using zinc as a material for the target 6 and oxygen as the reactive gas and introducing the gas in the reaction vessel 1 through the gas accelerating nozzle 7, a desired thin layer was deposited on the substrate 5.

Test 2: By a reactive sputtering method using aluminum as a material for the target 6 and nitrogen or ammonia diluted by nitrogen as the reactive gas, a desired thin layer was deposited on the substrate 5.

Figure 5:
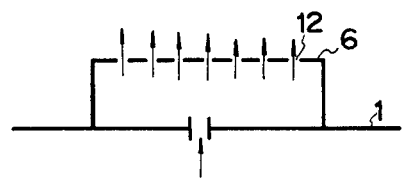
FIG. 5 and FIG. 6 show sectional views illustrating further embodiments according to the present invention.

Test 3: By making the target 6 of a metal like stainless, zinc, etc., and providing the target 6 with pores 12 as shown in FIG. 5 and using the plasma CVD (chemical vapour deposition) method wherein alkylzinc diluted by carrier gas of hydrogen, etc. leaks from the pores 12, a desired CVD layer was deposited on the substrate 5.

Test 4: By making the target 6 of a metal such as stainless steel, aluminum, etc. and using the plasma CVD method employing alkylaluminum diluted by carrier gas of hydrogen, etc. to leak from the pores 12, a desired CVD thin layer was deposited on the substrate 5.

Figure 6:
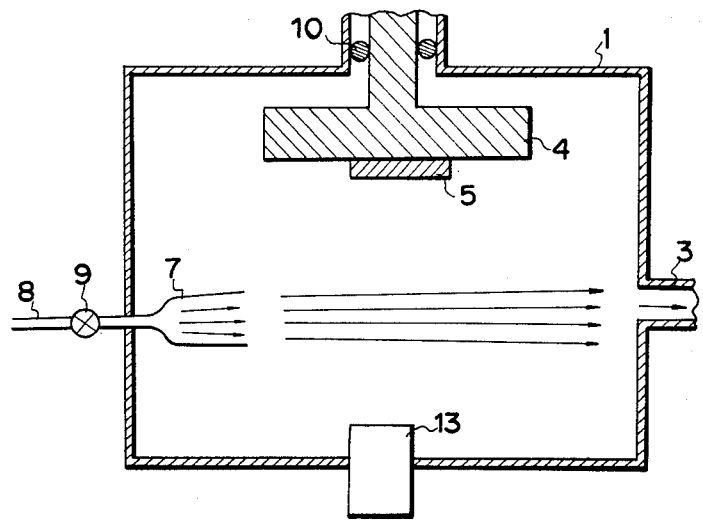

The gas accelerating nozzle 7 may be provided within an ion plating apparatus comprising a conventionally known ion plating means 13 as shown in FIG. 6 to deposit a desired thin layer.

Figure 7A:
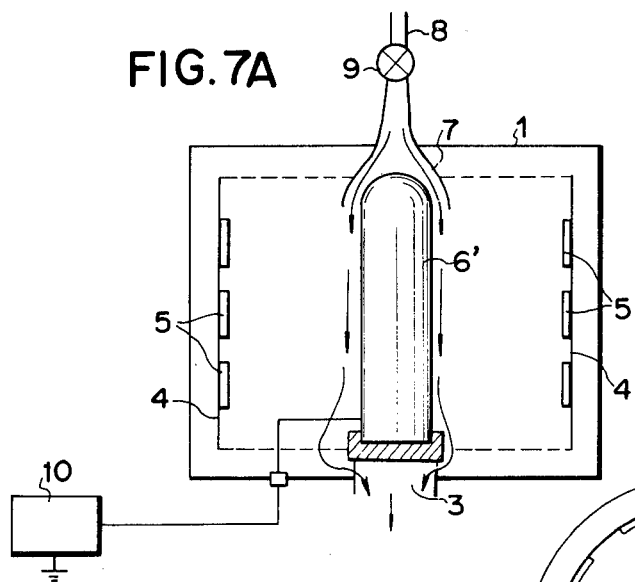
FIG. 7(A) and 7(B) show a sectional and top views illustrating a further embodiment according to the present invention.
Figure 7B:
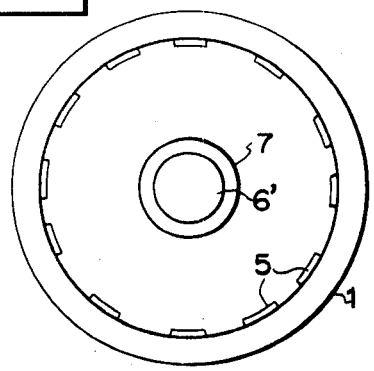

FIGS. 7(A) and 7(B) show a sectional and top views illustrating a sputtering apparatus according to the present invention wherein the same parts as in FIG. 3 are designated by the same reference numerals. The target 6' has a cylindrical configuration around which the substrates 5 are positioned. Reactive gas is introduced from the direction adjacent to one end of the target 6' along the periphery toward the other end thereof. The gas accelerating nozzle 7 provided in the reaction vessel 1 permits the thermal motion velocity of each reactive gas molecule to be converted into kinetic speed of the axial direction (longitudinal direction x) of the nozzle 7 when the reactive gas is introduced in the reaction vessel 1 through the gas accelerating nozzle 7 as shown in FIG. 4, resulting in maintaining the longitudinal diffusion speed $V_x$ of the reactive gas is made faster than the horizontal diffusion speed $V_y$. Therefore, in accordance with the design of the periphery of the sidewall 7A of the gas accelerating nozzle 7 in FIG. 4, the reactive gas flow can be accelerated to the substantially same speed as the thermal motion velocity of the gas molecule, as the velocity is effectively converted into kinetic speed along the axial direction of the gas accelerating nozzle 7. Therefore, the relation $V_x \geq V_y$ can be easily realized. This enables formation of a thin gas flow, sufficiently accelerated and having the least horizontal diffusion component with respect to the gas flow, on the target 6' and formation of two gas flows with different gas pressure, one with higher pressure on the target 6' and the other with lower pressure on the substrate 5, respectively. Further, when the gas accelerating nozzle 7 is positioned axially with respect to the target 6', re-adhesion of the sputtering material on the target 6' can be reduced and more effective acceleration of the gas flow can be realized.

Accordingly, it is possible to form a thin gas glow with high pressure on the surface of the target resulting in reduction of scattering of the sputtered material and improvement of the sputtering rate.

Further, a thin layer with good crystallization can be deposited keeping the theoretical chemical composition of the material to be sputtered.

Figure 8:
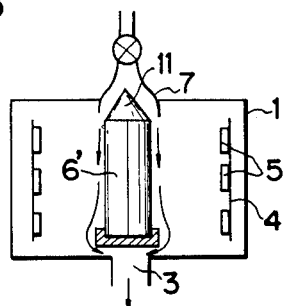
FIG. 8 through FIG. 11 show sectional views illustrating further embodiments according to the present invention.

FIG. 8 shows a further embodiment according to the present invention wherein a conical cap 14 is provided at one end of the target adjacent to the gas accelerating nozzle 7 to improve the gas flow along the surface of the target. Also by grinding the end portion of the target, similar effect can be realized.

Figure 9:
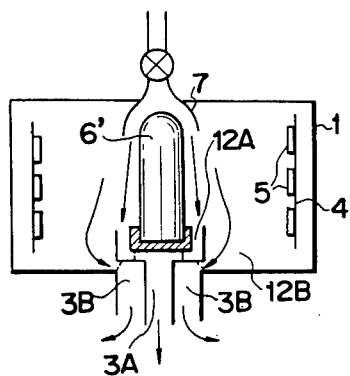

FIG. 9 shows a further embodiment according to the present invention wherein the outlet near the other end of the accelerating nozzle 7 is provided with a first vacuum discharge opening 3A and a second vacuum discharge opening 3B surrounding the first vacuum tube 3A. The numerals 12A and 12B refer to vacuum gauges for measuring degree of vacuum provided within the first and second vacuum discharge openings 3A and 3B, respectively. The gas flow may be further improved by simultaneously using these two independent vacuum discharge openings. When the discharge openings are connected to a low speed and a high speed vacuum pump, respectively, turbulence of the gas flow is controlled, so that formation of a thin layer gas flow with high pressure particularly near the target surface can be realized more effectively.

Figure 10:
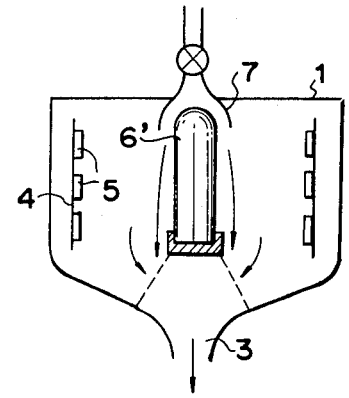

FIG. 10 shows a further embodiment according to the present invention wherein either the reactive gas inlet 2 or the outlet 3 of the reaction vessel 1, i.e. the gas outlet 3 for example, is formed in a funnel-like configuration. This arrangement enables reduction of turbulence of the gas flow in the embodiment shown in FIG. 9.

Figure 11:
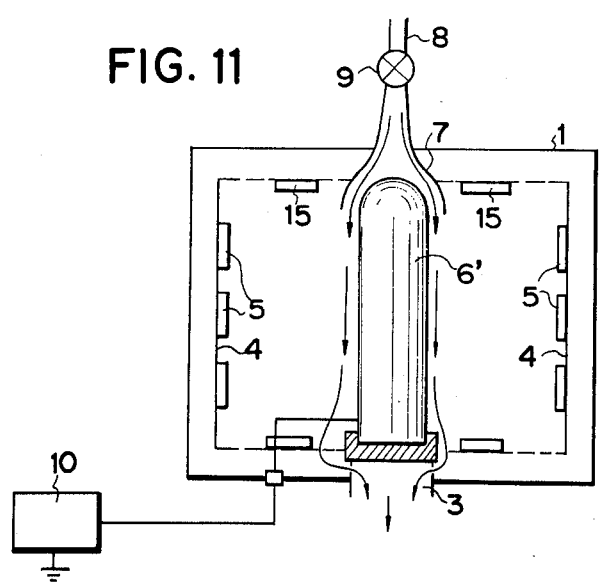

Further, a magnetic field generator such as a magnet assembly 15 may be provided near the target as shown in FIG. 11. When lines of magnetic force generated by the magnet assembly 15 act on the sputtering substance (particles), not only is the sputtering efficiency increased but also the plasma flow is concentrated near the target, so that damage of the substrate due to the plasma flow is reduced. Thus, it is possible to further increase the sputtering rate and realize evenness of the layer thickness and improve the layer quality.

As apparent from the description, according to the present invention wherein a gas accelerating nozzle is provided in a reaction vessel for introducing reactive gas in the reaction vessel through the gas accelerating nozzle so that longitudinal (along the gas flow) diffusion speed is kept as fast as or faster than the lateral diffusion speed, it is possible to realize a desired gas pressure profile.

Therefore, scattering and re-adhesion of sputtering substances are reduced, allowing improvement of sputtering rate and prevention of abnormal growth of the layer. Further, the best condition of c axis orientation can be realized also maintaining the ideal chemical composition of the layer.

The present invention is particularly effective when depositing a layer of a conjugated material.

We claim:

1. A thin layer depositing apparatus which comprises:
 a reaction vessel;
 substrates supported within said reaction vessel;
 a gas accelerating nozzle provided within said reaction vessel;
 a gas supply means for supplying reactive gas to said reaction vessel through said nozzle; and
 a thin layer depositing means for depositing a thin layer on said substrate, said thin layer depositing means comprising a target positioned within said reaction vessel and a sputtering means for sputtering said target, and wherein said target has a cylindrical configuration and said substrates so positioned to surround the target allowing reactive gas to flow from said nozzle and along the longitudinal direction of the target.

2. A thin layer depositing apparatus which comprises:
 a reaction vessel;
 substrates supported within said reaction vessel;
 a gas accelerating nozzle provided within said reaction vessel;
 a gas supply means for supplying reactive gas to said reaction vessel through said nozzle; and
 a thin layer depositing means for depositing a thin layer on said substrate, said thin layer depositing means comprising a target positioned within said reaction vessel and a sputtering means for sputtering said target, and wherein a magnetic field generating means is further provided near the target.

3. An apparatus as claimed in claim 1 or 2 wherein a conical flow-directing cap is provided at one end portion of the target near said nozzle.

4. An apparatus as claimed in claim 1 or 2 wherein said reaction vessel is provided with two discharge openings.

5. An apparatus as claimed in claim 1 or 2 wherein said reaction vessel is provided with a funnel-like discharge opening.

6. A thin layer depositing apparatus for coating objects, said apparatus comprising:
 a reaction vessel;
 support means for holding said objects disposed within said vessel;
 gas supply means for supplying a gas supply into said reaction vessel;
 vacuum pumping means for maintaining the pressure of said gas at a chosen level within said vessel;
 means for creating a gas discharge within said gas in said vessel;
 means for creating atoms of a chosen species from a source to react with said gas in transit to said object; and
 flow-directing nozzle means associated with said gas supply means for confiningly directing the gas flow through said vessel substantially along a chosen portion of the interior of said vessel.

7. An apparatus as claimed in claim 1, 2, or 6 wherein said thin layer depositing means is an ion plating means.

8. The apparatus of claim 6 wherein said means for creating atoms includes means for creating a sputtering discharge in said reactive gas and having at least a pair of sputtering electrodes associated therewith, at least one of which serves a target for producing sputtered atoms.

9. The apparatus of claim 8 wherein said target has a cylindrical configuration, said support means are disposed to hold said objects surrounding said target at a distance therefrom, and said nozzle means is oriented to direct the flow of said gas generally axially along and proximate to the surface of said cylinder.

10. The apparatus of claim 9 wherein the end of said cylindrical target approximate to said nozzle means is configured with a conical cap pointing towards said nozzle means.

11. The apparatus of claim 6 wherein said vacuum pumping means includes at least one pumping port through which said gas flow is exhausted from said vessel, said at least one port being disposed generally on the axis defined by said flow directing nozzle means.

12. The apparatus of claim 11 wherein said vacuum port is configured with a funnel-like discharge opening.

13. The apparatus of claim 8 wherein said means for creating a gas discharge within said gas includes means for creating a magnetic field in the vicinity of said target.

14. The apparatus of claim 6 wherein said atoms of a chosen species are ionized atoms.

* * * * *